United States Patent [19]

Miyagi et al.

[11] Patent Number: 5,433,784
[45] Date of Patent: Jul. 18, 1995

[54] VERTICAL TREATING APPARATUS HAVING A RESTRICTING MEANS FOR AVOIDING MISALIGNMENT

[75] Inventors: Katsushin Miyagi; Tetsu Ohsawa, both of Sagamihara, Japan

[73] Assignees: Tokyo Electron Kabushiki Kaisha; Tokyo Electron Tohoku Kabushiki Kaisha, both of Tokyo, Japan

[21] Appl. No.: 179,708

[22] Filed: Jan. 11, 1994

[30] Foreign Application Priority Data

Jan. 13, 1993 [JP] Japan .................... 5-020555

[51] Int. Cl.⁶ ............................. C23C 16/00
[52] U.S. Cl. ...................... 118/715; 118/729
[58] Field of Search ............. 118/715, 729, 725, 727; 432/241, 242, 205

[56] References Cited

U.S. PATENT DOCUMENTS

| | | |
|---|---|---|
| 4,943,235 | 7/1990 | Nakao et al. |
| 4,985,372 | 1/1991 | Narita .................... 437/192 |
| 5,217,753 | 6/1993 | Goodman et al. ........... 427/166 |
| 5,226,812 | 7/1993 | Sakata .................... 432/241 |
| 5,378,283 | 1/1995 | Ushikawa ................. 118/715 |

FOREIGN PATENT DOCUMENTS 63-120326 2/1988 Japan .

*Primary Examiner*—Olik Chaudhuri
*Assistant Examiner*—Brian K. Dutton
*Attorney, Agent, or Firm*—Beveridge, DeGrandi, Weilacher & Young

[57] ABSTRACT

The vertical treating apparatus according to this invention comprises as major units a process tube for receiving objects to be treated through an opening in a lower part thereof, a lift mechanism (boat elevator) for mounting a wafer boat holding the wafers to load the wafers into the process tube, and a wafer transfer device for transferring the wafers to the lift mechanism. The lift mechanism flexibly supports a cap for closing the opening of the process tube by way of an urging force provided by coil springs, and mounts the wafer boat for holding the wafers on the upper surface thereof. A cap restricting member is provided for restricting the urging force of the coil springs. The cap is provided at a lowermost position of the lift mechanism. Thus, the cap is restricted by the cap restricting member when the wafers are transferred by the transfer device, whereby the wafer boat, etc. are kept from tilting due to flexure of the coil springs, so that particle sticking to the wafers and wafer damage can be avoided.

21 Claims, 4 Drawing Sheets

VERTICAL TREATING APPARATUS HAVING A RESTRICTING MEANS FOR AVOIDING MISALIGNMENT

BACKGROUND OF THE INVENTION

This invention relates to a vertical treating apparatus for use in various treatments, such as the heat treatment of objects to be treated, e.g., semiconductor wafers.

Conventionally vertical heat treating apparatuses have been generally used in oxidation, diffusion, CVD, etc. of objects to be treated, such as semiconductor wafers (hereinafter called wafers) in fabrication processes of semiconductors. Such a vertical heat treating apparatus includes a process tube as a heat treating unit which holds wafers therein to conduct a heat treatment, and a load lock chamber below the process tube and a manifold therebetween. The manifold is a space unit interconnecting the process tube and the load lock chamber and also defines a shielding space for shielding the wafers which are to be treated or have been treated in the process tube.

As shown in FIG. 6, wafers W are set on a wafer boat 12 from the side of the load lick chamber 6 and are loaded into the process tube 1. In the load lock chamber 6 there is provided a boat elevator 13 as a lift mechanism for moving up and down the wafer boat 12 to load the wafers W into the process tube 1 through an opening 3 of the manifold 5. On the upper surface of the boat elevator 13 there is provided a cap 16 which is a closing member for closing the opening 3 of the manifold 5 when the wafer boat 12 is loaded and for shutting the process tube 1 and the load lock chamber 6 from each other. An O-ring 18 is attached to the peripheral edge of the upper surface of the cap 16 for sealing between the opening surface 15 of the manifold 5 and the cap 16. The cap 16 is flexibly supported by a plurality of coil springs 17 on the upper surface of the arm of the boat elevator 13 so as to be brought into close contact with the opening surface 15 of the manifold 5 which is a stationary member.

But in the vertical heat treating apparatus of such structure, when the wafer boat 12 is lowered to transfer wafers W, in the case that coil spring 17 supporting the wafer boat 12 is soft, the coil spring 17 is flexed due to a load of, e.g., the wafer boat 12, etc. mounted on the cap 16 and tilts the wafer boat 12. As a result, the arm of the wafer transfer means can come in contact with the wafer boat 12 or wafers W mounted on the arm, and particles can stick to the wafers W. Accordingly there is a problem that yields may be lowered. Another problem is that the arm, etc. of the wafer transfer means collide with the wafer boat 12, and the wafers W are damaged. To solve these problems, consideration has been given to the use of a coil spring 17 which is hard. But a problem with this case is that the cap 16 is not brought into perfect close contact with the opening surface 15 of the manifold 5.

To solve these problems, as shown in FIG. 7, reliance has been placed on the cap 16 which comprises a disk 16a secured to the upper surface of the arm of the boat elevator 13, and an O-ring support member 16c connected to the disk 16a through a bellows 16b and having an O-ring 18 which is brought into close contact with the opening surface 15 of the manifold 5 (Japanese Utility Model Laid-Open Publication No. 120326/1988). But problems with such cap 16 include a complicated structure that accordingly incurs high costs, and the inside surface of the bellows 16b has a number of concavities and convexities which cannot be easily cleaned.

SUMMARY OF THE INVENTION

In view of these problems, this invention has been made, and an object of this invention is to provide a vertical treating apparatus which has a simple structure, and flexibly supports objects to be treated (e.g., wafers) to preclude inconveniences, such as tilting of the wafer boat, etc. due to flexure of flexible means, such as a spring, a bellows or other when the objects to be treated are transferred.

To achieve this object, this invention relates to a vertical treating apparatus which includes a treatment unit for receiving objects to be treated through an opening formed in a lower portion thereof and for treating the objects as required, a lift mechanism for mounting holding means for holding the objects to be treated and for loading the holding means into the treatment unit from below, and transfer means for transferring the objects to be treated onto the holding means, the apparatus further comprising a closing member flexibly supported by urging means on the lift mechanism, and provided for mounting the holding means on the upper surface thereof, and for closing the opening. The apparatus also including, restricting means for restricting an urging force of the urging means for urging the closing member to a lowermost position of the closing member of the lift mechanism.

In this invention, the restricting means is arranged so as to support a peripheral edge of the underside of the closing member, or to be moved from a position where the restricting member does not interfere with upward and downward movement of the closing member onto the closing member to press a peripheral edge of the upper surface of the closing member.

According to the vertical treating apparatus of this invention, the restricting means for restricting an urging force of the flexible means for urging the cap member is provided at a lowermost position of the closing member of the lift mechanism, whereby when objects to be treated are transferred onto the closing member, the closing member is restricted by the restricting means to preclude tilt or other movement of the holding means, etc. due to flexure of the urging means for the closing member. When the closing member is lifted to close the opening of the treatment unit, the urging force is applied to the closing member, whereby the opening of the treatment unit is securely closed.

DETAILED DESCRIPTION OF THE PREFERRED EMBODIMENTS

Embodiments of the vertical treating apparatus according to this invention will be explained with reference to the drawings attached hereto.

A First Embodiment

Figure 1:
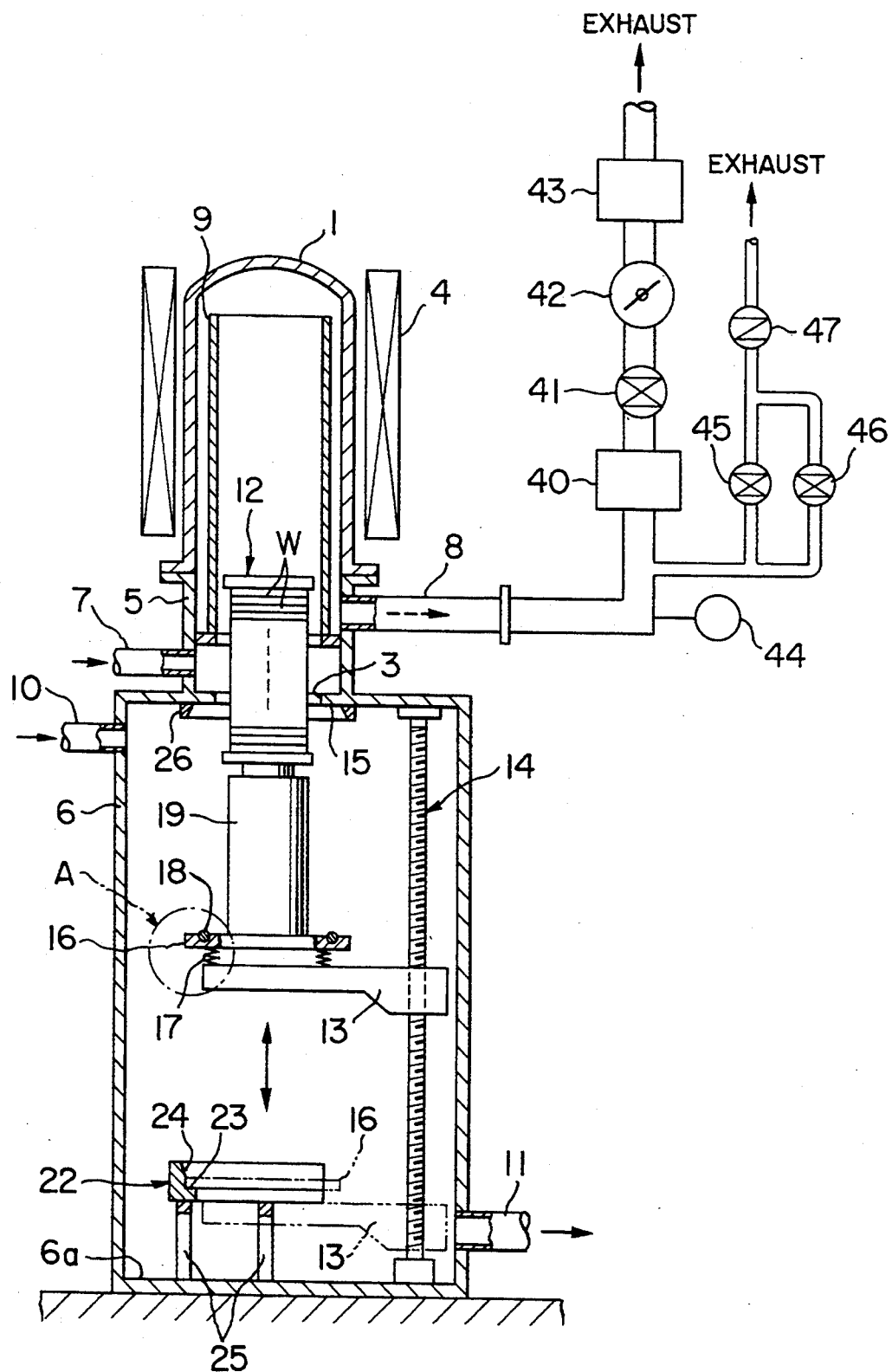
FIG. 1 is a vertical sectional view of the vertical treating apparatus according to a first embodiment of this invention.

FIG. 1 shows a vertical sectional view of the vertical treating apparatus according to a first embodiment of this invention which is applied to a vertical heat treatment apparatus. In FIG. 1 reference numeral 1 represents a process tube which is a heat treatment unit having an opening 3 in its bottom through which wafers W are loaded. A heater 4 is provided around the process tube 1. The process tube 1 is formed of a heat resistant material, such as quartz or others, which does not affect the objects to be treated, and has a cylindrical shape having the upper end closed.

Below the process tube 1 there is provided a load lock chamber 6 and a manifold 5. A gas feed pipe 7 and an exhaust pipe 8 are connected to the manifold 5 for letting in various treatment gases. A cylindrical partition wall 9 of a heat resistant material, such as quartz, is provided in the process tube 1. The treatments gases are ascended in the process tube 1 along the partition wall 9, and descended back to the manifold 5 along the outside of the partition wall 9 to be discharged outside the process tube 1 through the exhaust pipe 8.

The load lock chamber 6 has a gate (not shown) in the wall thereof for loading and unloading wafers to be treated or the treated wafers, and is connected to an inert gas feed pipe 10 and an inert gas exhaust pipe 11.

In the load lock chamber 6 there is provided a wafer boat 12 as a holder for holding wafers W on vertically spaced multi-shelves and the boat is moved up and down in the load lock chamber 6. There is also provided a boat elevator 13 as a lift mechanism for loading and unloading the wafers into and from the process tube 1. The boat elevator 13 has a drive mechanism 14 in the form of a pole screw or others. On the upper surface of the boat elevator 13, a disk cap 16 is supported on the upper surface of the boat elevator 13 flexibly by means of urging or biasing means such as a plurality of coil springs 17. The wafer boat 12 is to be mounted on the disk cap 16, and when the wafer boat 12 is loaded, the disk cap 16 closes an opening surface 15 (the underside of an opening 3) of the manifold 5, An O-ring 18 is provided on the peripheral edge of the upper surface of the cap 16 for sealing the opening surface 15 of the manifold 5. A heat insulating cylinder 19 is provided integrally on the cap 16 for supporting the wafer boat 12 and forming a uniform temperature region.

Figure 2:
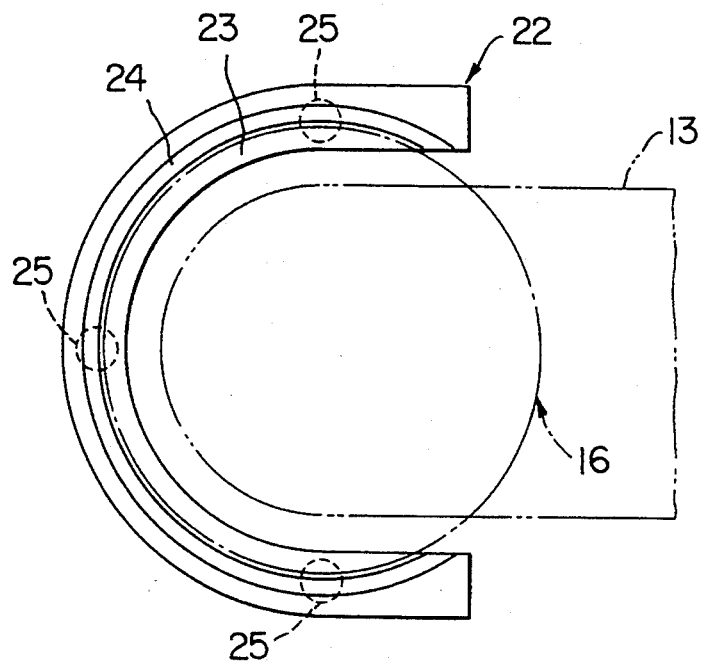
FIG. 2 is an enlarged plan view of the cap restricting member in FIG. 1.
Figure 4:
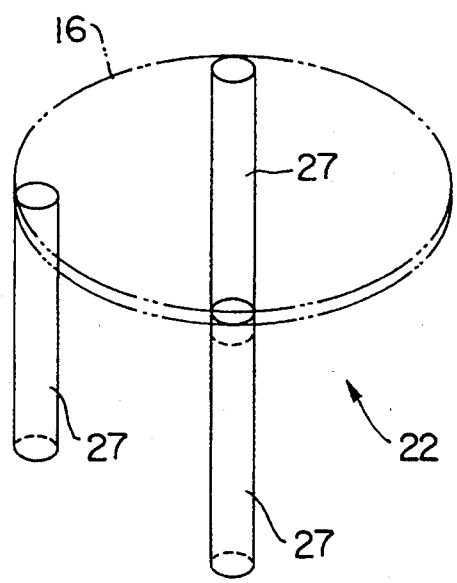
FIG. 4 is a perspective view of a variation of the cap restricting member in FIG. 1.

A cap restricting member 22, which is for restricting an urging force of the coil springs 17 for urging the cap 16, is disposed at a position where the wafers W on the wafer boat 12 have been lowered, i.e., the lowermost position of the cap 16. As shown in FIGS. 1 and 2, the cap restricting member 22 is formed in a U-shaped horizontal section for supporting the peripheral edge of the underside of the cap 16 without interference with the boat elevator 13, and has on the upper surface a mount surface 23 for the cap 16 to be mounted on. The cap restricting member 22 has a guide 24 (a slant surface) which helps guide and position the descending cap 16 onto the mount surface 23, and restricts horizontal movement of the cap 16. The cap restricting member 22 is fixed at a certain height from a bottom surface of the load lock chamber 6 by support rods 25.

A guide member 26 is provided on the opening surface 15 of the manifold 5 for guiding and positioning the ascending cap 16 onto the opening surface 15, and restricting horizontal movement of the cap 16.

As shown in FIG. 1, the exhaust pipe 8 is connected to a vacuum exhaust system which comprises trapping means for trapping reaction products contained in the exhaust gas, e.g., a water cooling trap 40, a main valve 41 for opening and closing the exhaust piping from the process tube 1 and the vacuum exhaust system, automatic pressure control means for controlling an exhaust pressure of the exhaust system, e.g., a butterfly valve 42 and a vacuum pump 43 for vacuum exhaust, e.g., a mechanical booster pump or a rotary pump which are connected in the stated order. A pressure sensor 44, e.g., parametron sensor, for measuring a pressure in the process tube 1 is provided on the exhaust pipe 8 on the side thereof nearer to the process tube 1. The exhaust pipe 8 is also connected to a vent valve 45, e.g., an air operated valve, which is opened at the atmospheric pressure, and a vent valve 46, e.g., an air operated valve, provided in parallel with the vent valve 45, which is opened at a positive pressure, e.g., 780 Torr, and the two vent valves 45, 46 are connected to an exhaust system through a counter-flow valve 47 for preventing the reverse flow of the exhaust gas provided at the junction of the two vent valves 45, 46.

Figure 3:
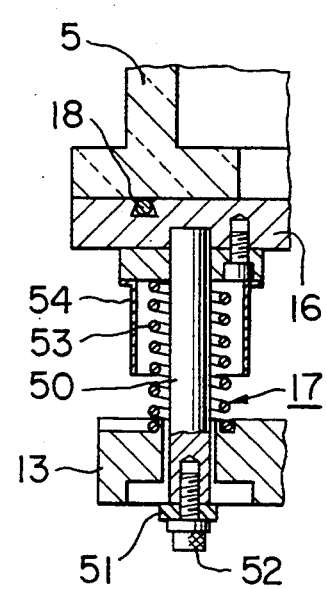
FIG. 3 is an enlarged vertical sectional view of the part A in FIG. 1 showing the cap supporting mechanism.

With reference to FIG. 3, the support mechanism for the cap 16 of the vertical treating apparatus according to this embodiment will be explained.

The cap 16 is supported on the arm of the boat elevator 13 as the lift mechanism by a plurality (E.G., 3) of flexible support means 17. The respective support means 17 are set at angular positions, at 120° in this embodiment, which equally divide a center angle of the cap 16. A support rod 50 slidably passed through the arm is secured to the cap 16, and a flange 51 is fixed by a bolt 52 to the lower end of the support rod 50 passed through the arm, and the flange 51 sets a range of vertical movement of the cap 16. A coil spring 53 is provided as flexible means between the cap 16 and the arm. The coil spring 53 is supported by the support rod 50 and is protected by a protection cylinder 54 provided on the side of the cap 16.

The operation of the vertical treating apparatus according to the above-described first embodiment will be explained hereinafter. When a heat treatment is over on wafers W in the process tube 1, the wafer boat 12 is lowered by the boat elevator 13 out of the process tube 1 down to the wafer transfer position in the load lock chamber 6. As the boat elevator 13 is lowered, as shown in FIG. 1, the cap 16 which has closed the opening surface 15 of the manifold 5 leaves the opening surface 15 of the manifold 5 and travels down to the lowermost position indicated by the chain line, where the cap 16 is guided by the guide 24 of the cap restricting member 22 to be mounted on the mount surface 23. Thus the movement of the cap 16 flexibly supported by the coil spring 17 is restricted, so that when the wafers W are transferred by the wafer transfer means, the coil springs 17 do not flex, causing the wafer boat 12 to tilt with a result that the inconveniences (particles sticking to the wafers W, damages of the wafers W, etc.) due to the flexure of the coil springs 17 can be prevented without failure. The cap restricting member 22 has a simple structure which simply supports the peripheral edge of the underside of the descending cap 16 and can be readily and at low costs provided in apparatuses in use.

Although the guide 24 is formed on the cap restricting member 22 of the first embodiment, the guide 24 is not essential. The cap restricting member 22 can be a simple flat plate of U-shaped cross-section. That is, what is required of the cap restricting member 22 is to preclude unstable states of the cap 16 caused by the coil springs 17 in transferring the wafers W, and the cap restricting member 22 may be provided by a plurality (e.g., 3) of rods 27 which simply support the peripheral edge of the underside of the cap 16 at the upper ends thereof.

A Second Embodiment

Figure 5:
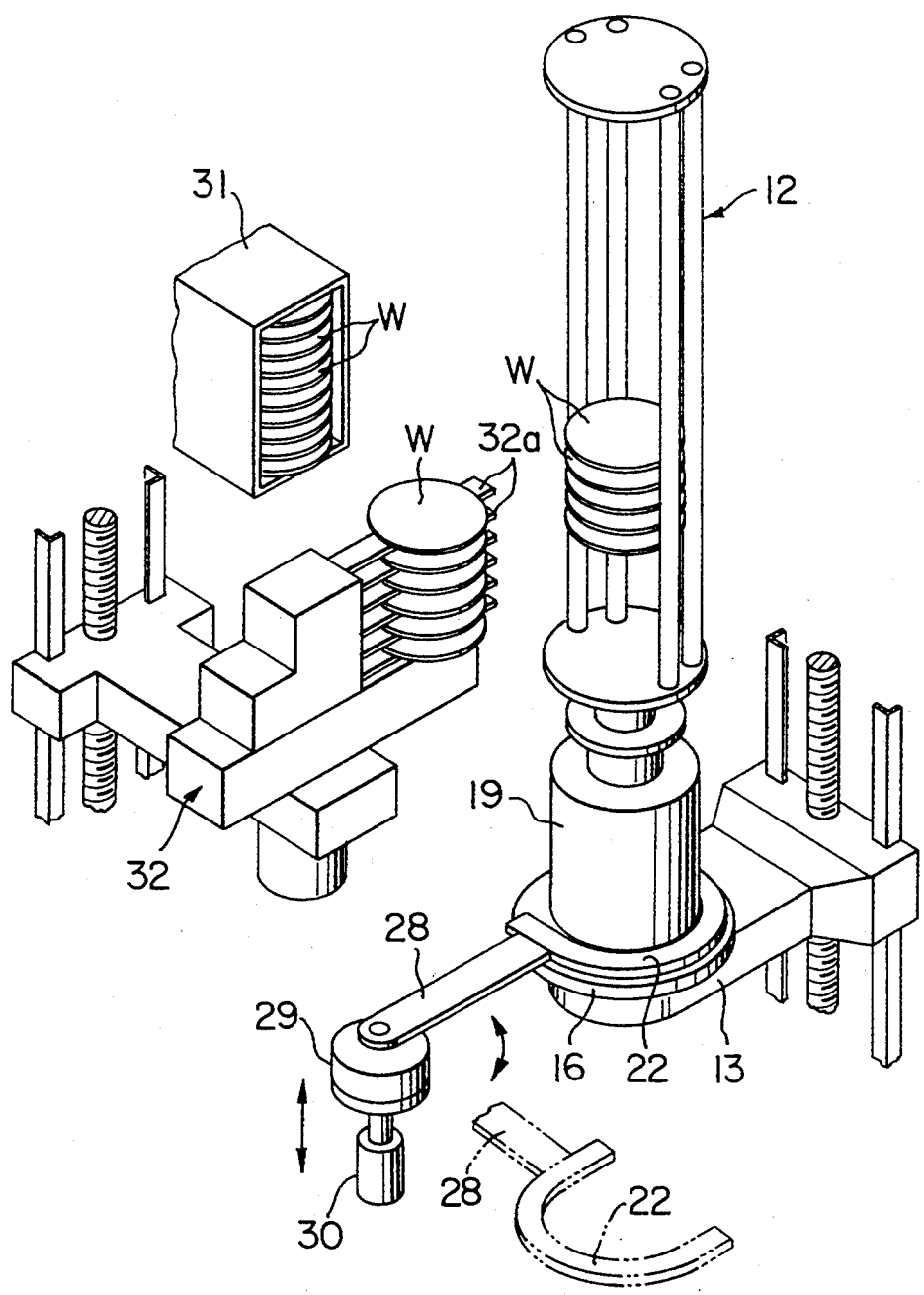
FIG. 5 is a perspective view of the vertical treating apparatus according to a second embodiment of this invention.
Figure 6:
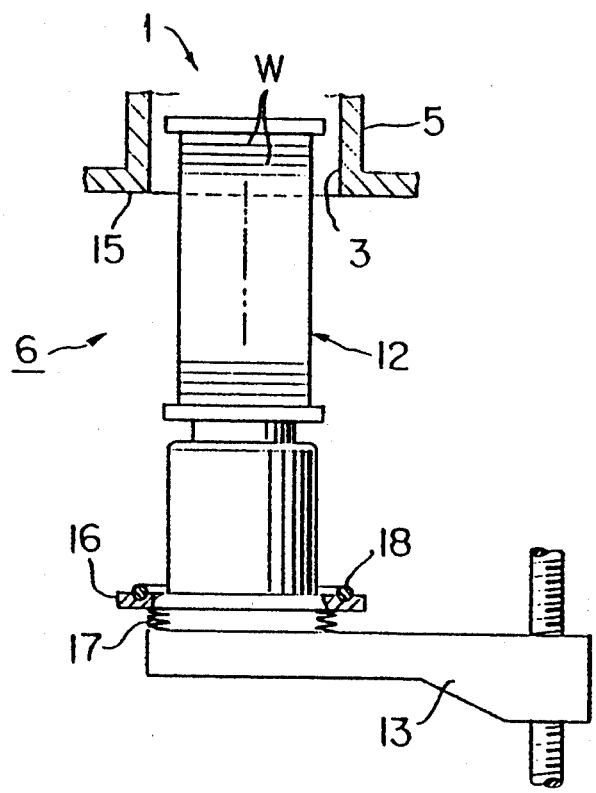
FIG. 6 is a partial side view of a conventional vertical treating apparatus.
Figure 7:
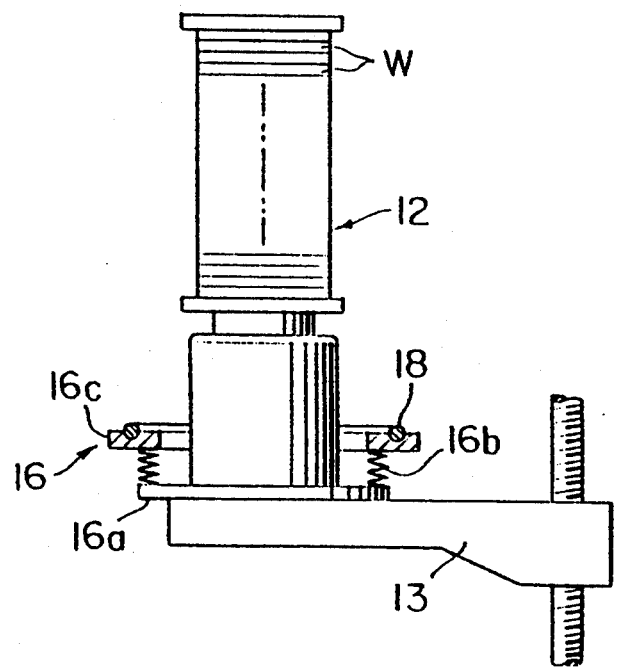
FIG. 7 is a partial side view of another conventional vertical treating apparatus.

FIG. 5 is a perspective view of the vertical treating apparatus according to a second embodiment of this invention. In this second embodiment, the cap restricting member 22 is moved from a position where the cap restricting member 22 does not interfere with the upward and downward movements of the cap 16 onto the cap 16 at the lowermost position so as to press the peripheral edge of the upper surface of the cap 16. In this case, the cap restricting member 22 is formed in U-shaped cross-section so as to be kept from the interference with the heat insulating cylinder 19 on the cap 16 to press the upper surface of the cap 16, and has an arm 28 provided on one side thereof. On the proximal end of the arm 28 there are provided a rotation mechanism 29 (e.g., a motor) and a vertical motion mechanism (e.g., an air cylinder) 30. The rotation mechanism 29 is for turning the cap restricting member 22 from its waiting position, indicated by the chain line, where the cap restricting member 22 does not interfere with the upward and downward movement onto the upper surface of the cap 16. The vertical motion mechanism 30 urging the cap 16 downward against an urging force of the coil springs 17 (in FIG. 5 the cap 16 is invisibly held by the arm of the lift mechanism 13).

The means for moving the cap restricting member 22 from the waiting position where the cap restricting member 22 does not interfere with the upward and downward movement of the cap 16 onto the cap 16 is not limited to the rotation mechanism 29 and can be provided by, e.g., a reciprocating mechanism which linearly advances and retreats the cap restricting member 22.

As shown in FIG. 5, wafer transfer apparatus 32 as means for transferring the wafers W in a wafer carrier (cassette) 31 onto the wafer boat 12 is provided on one side of the wafer boat 12 when the wafer boat 12 is at the wafer transfer position. To this end a transfer arm 32a of the wafer transfer apparatus 32 may be formed in U-shaped cross-section. The cap restricting function is provided by the cap restricting member 22, so that a number of the constituent members can be small, and the apparatus can be generally small-sized.

In the respective embodiments the vertical treating apparatus according to this invention is applied to a heat treating apparatus for semiconductor wafers, but needless to say, is applicable to, e.g., vertical treating apparatuses for conducting heat treating or other treatments on objects to be treated other than semiconductor wafers, such as glass substrates, LCD substrates, etc.

The vertical treating apparatus according to this invention, which has the above-described structure can produce the following advantageous effect.

Since the restricting means for restricting an urging force of the urging means for urging the closing member is provided at the lowermost position of the closure member of the lift mechanism, in a vertical treating apparatus having a closing member of a simple structure supported by urging means, the closing means can be prevented from tilting due to flexure of the urging means when objects to be treated are transferred, with results that particles sticking to the objects to be treated, damages of the objects to be treated, etc. can be precluded, and yields can be accordingly improved.

Since the restricting means for the closing member is arranged to support the peripheral edge of the underside of the closing member, or to be moved from a position where the restricting means does not interfere with the upward and downward movement of the closing member onto the closing member to press the peripheral edge of the upper surface of the closing member, the structure of the restricting means can be so simple that the restricting means is applicable to treating apparatuses in use, and its maintenance, such as cleaning, etc. can be easy.

Since the restricting means is provided by the transfer means, constituent members can be lessened, and the treating apparatus can be small-sized.

What is claimed is:

1. A vertical treating apparatus, comprising:
   a treatment unit having an opening formed in a lower region thereof for receiving a supported holding means holding objects to be treated;
   a lift mechanism dimensioned and arranged for loading the holding means into the treatment unit from below;
   transfer means for transferring the objects to be treated to the holding means;
   closing means for closing the opening, said closing means having a mounting surface for receipt of the holding means;
   urging means supported by said lift mechanism and contacting said closing means so as to urge said closing means into sealing contact with a surface defining the opening when said lift mechanism is in a raised state;
   restricting means for fixing an urging force of said urging means when said lift mechanism is in a lowered state such that said closing means and the holding means are restricted in position so as to avoid misalignment during operation of said transfer means.

2. The vertical treating apparatus according to claim 1, wherein said restricting means is arranged so as to support a peripheral edge of an underside portion of said closing means.

3. The vertical treating apparatus according to claim 2, wherein said restricting means comprises a horseshoe member having a guide surface on an inside surface thereof for guiding said closing means.

4. The vertical treating apparatus according to claim 2, wherein said restricting means is comprised of a plurality of support rods extending up from an underlying support surface.

5. The vertical treating apparatus according to claim 1, wherein said restricting means is moved by a moving device first from a position where said restricting means does not interfere with upward and downward movement of said closing means to a second position wherein said restricting means contacts a peripheral edge of an upper surface of said closing means.

6. The vertical treating apparatus according to claim 5, wherein said moving device includes a rotation mechanism wherein said restricting means is moved into contact with the closing means by a rotation of said rotation mechanism.

7. The vertical treating apparatus according to claim 6, further comprising a vertical motion mechanism for vertically moving said restricting means against an expansive force of said urging means so as to vertically shift said closing means.

8. The vertical treating apparatus according to claim 5, wherein said restricting means is moved linearly back and forth and is moved upward and downward by a vertical motion mechanism to press said closing means against said urging means.

9. The vertical treating apparatus according to claim 1, wherein said restricting means includes a U-shaped transfer arm which presses a peripheral edge of an upper surface of said closing means.

10. The vertical treating apparatus according to claim 1, wherein said vertical treating apparatus is dimensioned and arranged for treating semiconductor wafers.

11. The vertical treating apparatus according to claim 1, wherein said vertical treating apparatus is dimensional and arranged for treating glass substrates.

12. The vertical treating apparatus according to claim 1, wherein said vertical treating apparatus is dimensioned and arranged for treating LCD substrates.

13. A vertical treating apparatus, comprising:
   a treatment unit with an opening formed in a lower region thereof;
   a lift mechanism dimensioned and arranged for supporting a treatment object holder and for raising the treatment object holder from a lowered state, through the opening and into a raised treatment position within said treatment unit;
   a cap supported by said lift mechanism and having a surface dimensioned and arranged for receiving the treatment object holder supported by said lift mechanism, said cap further being dimensioned and arranged for closing said opening when the lift mechanism places said treatment object holder into said raised treatment position, said cap being secured to said lift mechanism by a biasing device; and
   a cap restricting member being dimensioned and arranged for contacting said cap when said lift mechanism is in a lowered state and for preventing tilting of said cap due to a flexure in said biasing device.

14. The vertical treating apparatus according to claim 13 wherein said restricting member is moved by a moving device from a first position wherein said restricting member does not interfere with upward and downward movement of said cap to a second position wherein said restricting member presses on a peripheral edge of an upper surface of said cap.

15. The vertical treating apparatus according to claim 13, wherein said restricting member is arranged so as to support a peripheral edge of an underside portion of said cap.

16. The vertical treating apparatus according to claim 13 wherein said restricting member includes a U-shaped transfer arm which presses a peripheral edge of an upper surface of said cap.

17. The vertical treating apparatus according to claim 13 wherein said restricting member comprises a horseshoe member which is stationery with respect to said lift mechanism and has a sloped guide surface on an inside surface thereof.

18. The vertical treating apparatus according to claim 13, wherein said restricting member is comprised of a plurality of support rods extending up from a common base support.

19. The vertical treating apparatus according to claim 13, further comprising a movement mechanism and wherein said restricting member includes a horseshoe shaped member which is rotated into contact with an upper portion of said cap by said movement mechanism and shifted downwardly against said biasing device by said movement mechanism.

20. The vertical treating apparatus according to claim 13, wherein said biasing device including a plurality of springs extending between a mounting arm of said lift mechanism and said cap.

21. The vertical treating apparatus according to claim 13, further comprising an upper guide member extending about a surface defining said opening and having a sloped interior surface.

* * * * *